United States Patent [19]

Yamamoto et al.

[11] 4,173,821
[45] Nov. 13, 1979

[54] METHOD OF PRODUCING SEMICONDUCTOR DEVICES

[75] Inventors: Masatoshi Yamamoto, Higashimurayama; Keisuke Makino, Funabashi; Kiyomi Suzukawa, Zushi; Souichirou Nakamura, Takasaki; Kiyomi Sakai, Sawa, all of Japan

[73] Assignee: Hitachi, Ltd., Japan

[21] Appl. No.: 827,091

[22] Filed: Aug. 23, 1977

[30] Foreign Application Priority Data

Aug. 25, 1976 [JP] Japan .................................. 51-100637

[51] Int. Cl.$^2$ ............................................. B01J 17/00
[52] U.S. Cl. ...................... 29/574; 29/576 S; 29/588; 264/234; 264/236; 264/272; 264/297
[58] Field of Search ....................... 29/574, 576 S, 588; 264/234, 236, 272, 297; 425/34

[56] References Cited

U.S. PATENT DOCUMENTS

| | | | |
|---|---|---|---|
| 2,953,840 | 9/1960 | Freeburg | 29/576 S |
| 3,444,441 | 5/1969 | Helda | 29/576 S |
| 3,469,953 | 9/1969 | St. Clair | 29/576 S |
| 3,881,241 | 5/1975 | Masuda | 29/574 |

*Primary Examiner*—W. Tupman
*Attorney, Agent, or Firm*—Craig and Antonelli

[57] ABSTRACT

In the process of fabrication of semiconductor devices, a lead frame hoop supplied from a supply reel is set forward to successively enter into a series of fabricating steps. After having been subjected to pellet bonding, wire bonding and resin-molding, it is wound up about a take-up reel. Baking step is performed with the lead frame hoop wound on the take-up reel. The lead frame hoop unwound from the take-up reel is cut into separate individual semiconductor device units from one another and the measurement of characteristics and the classification of the thus prepared units are carried out with the positions of the units maintained as they were at the cutting step. Accordingly, the process has a smaller number of steps and therefore the production cost is reduced, and the speed of working is improved.

13 Claims, 4 Drawing Figures

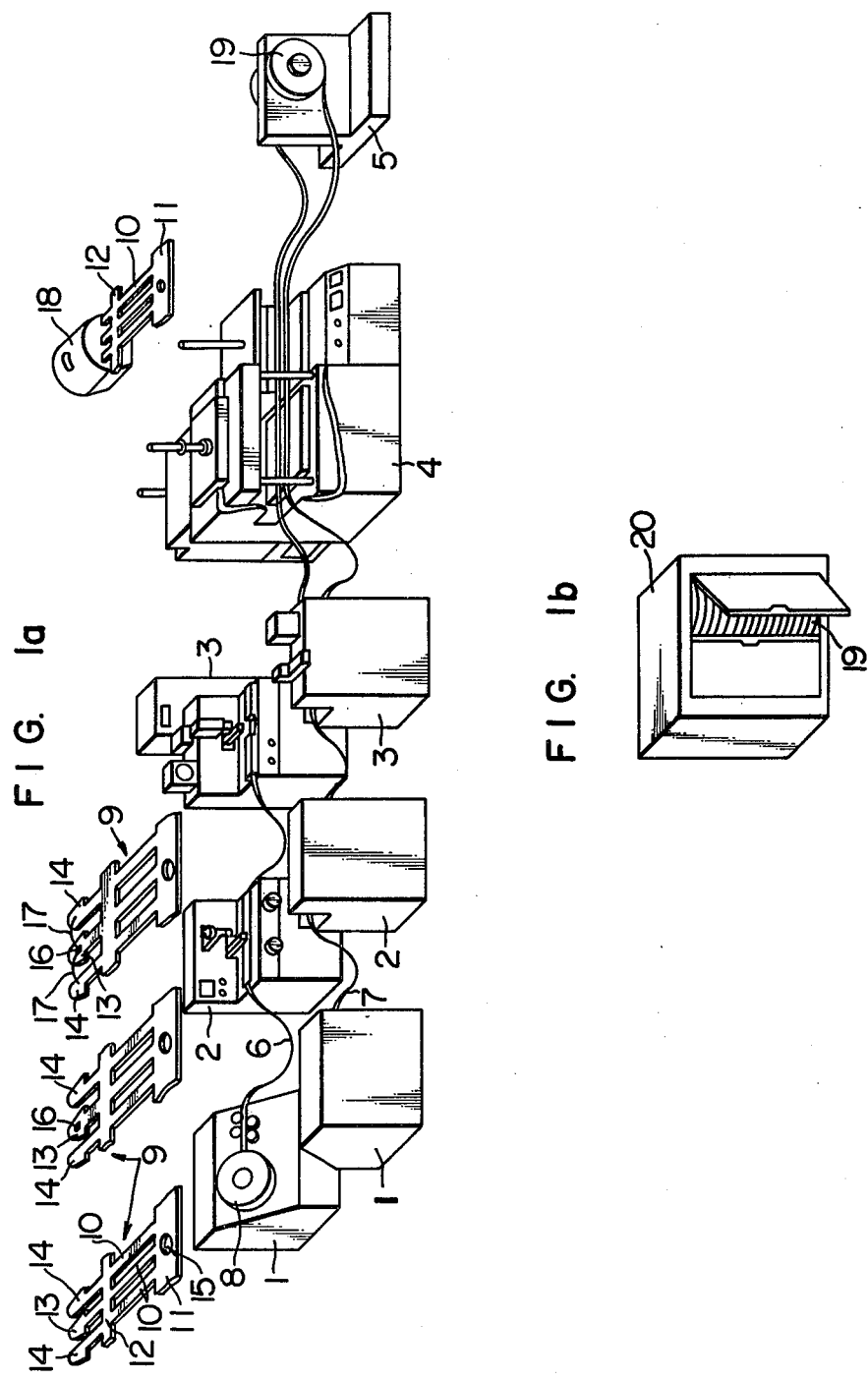

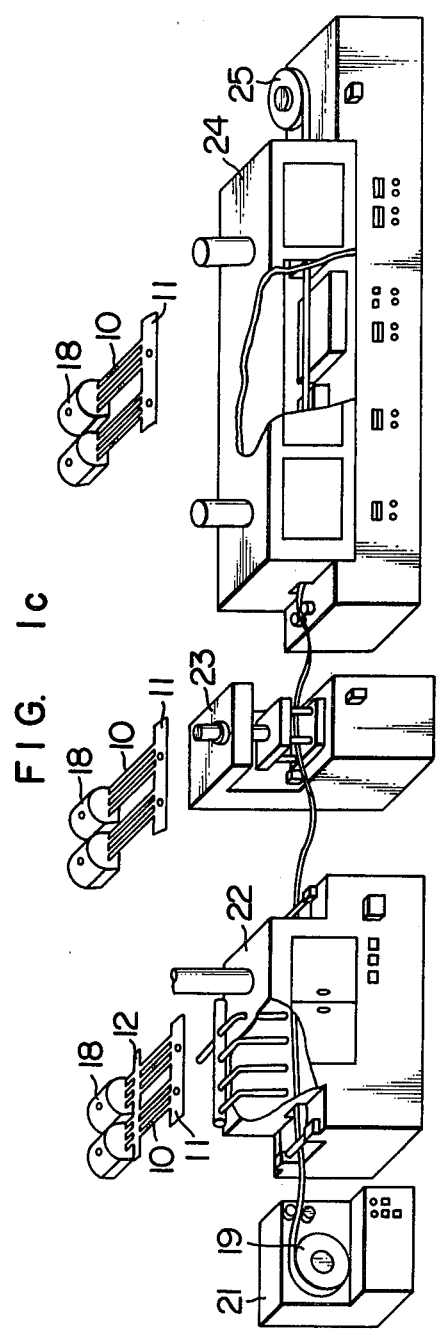
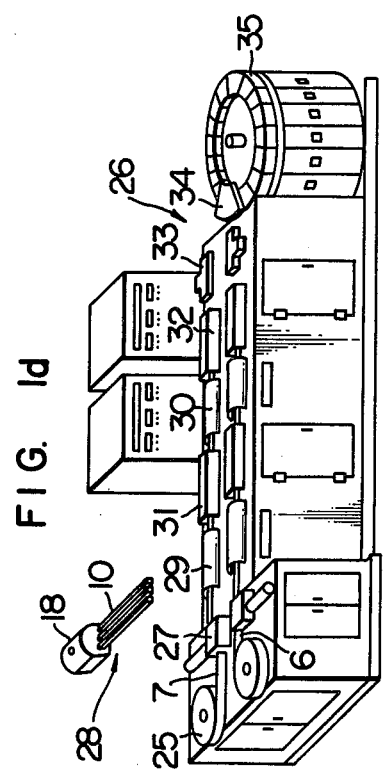
FIG. 1c
FIG. 1d

METHOD OF PRODUCING SEMICONDUCTOR DEVICES

LIST OF PRIOR ART REFERENCES (37 CFR 1.56 (a))

The following references are cited to show the state of the art:
Japanese Patent Publication No. 17859/64
U.S. Journal "Electronics" 1971 2/1 pages 44-48

BACKGROUND OF THE INVENTION

This invention relates to a method of fabricating semiconductor devices and more particularly to the fabricating steps to be performed after the attachment of electrodes to semiconductor pellets.

Usually, semiconductor devices such as transistors are fabricated using a metal plate called a lead frame. The lead frame for fabricating, for example, 25 transistors has 25 lead units with the same patterns repeatedly arranged in band. Each lead unit has three leads parallel disposed and a semiconductor element (pellet) is attached by means of gold foil onto the tip portion of the middle lead while the remaining leads have their end portions connected with the electrodes of the pellet by a fine wire. The end portions of the lead unit containing the bonding wires and the pellet are molded by resin and the parts of the leads protruding out of the resin mold are covered by solder layers. Then, the dams and the tie bars connecting the leads of each lead unit and the lead units with one another are cut away to produce individual transistors. The transistors thus prepared are subjected to characteristic selection in an automatic handler and then labelled with marks representing the classes of quality.

However, this process of fabrication, which is a batch process using a lead frame having 25 lead units for 25 semiconductor devices, has the following drawbacks. (1) In every step of process, a magazine for accommodating the lead frame is need for the easy handling of the lead frame. (2) The lead frame is liable to be deformed to be caught by the magazine when it is loaded on and unloaded from the magazine, so that the chances of faults in the assembler increases. (3) Since plural transfer molding machines are used to effect resin molding, the loading and unloading of the lead frame is difficult. If the loading and unloading operation is automatized, the mechanisms of the loader and the unloader become complicated and also expensive. (4) When the individual transistors are sent to a selector, they must be sent with their positions and orientations arranged in a predetermined manner. Moreover, the transistors to be sent to the selector, which are separated from one another, have a drawback that the leads are liable to be bent.

There has been proposed a method to eliminate the above drawbacks, according to which lead frame hoop (hoop material) in the form of a band, wound on a reel, is handled in assembly. This invention is directed also to such an assembling method as using hoop material.

SUMMARY OF THE INVENTION

One object of this invention is to provide a method of fabricating semiconductor devices, which consists of a smaller number of fabricating steps than a conventional method.

Another object of this invention is to provide a method of fabricating semiconductor devices, which uses no magazine to reduce the cost of installation.

Yet another object of this invention is to provide a method of fabricating semiconductor devices, according to which the assembly line is automatized to facilitate the supervision of the production line, to increase the speed of assembly and to improve the efficiency of assembly.

According to this invention, which has been made to attain the above objects, a lead frame hoop is used and the hoop is continuously sent to the respective steps of the assembly process so as to effect line assembly. In the baking step after the resin molding, the hoop wound about a reel is subjected to heat treatment for a batch process and in the step of characteristic selection the batch of semiconductor devices is separated by cutting into individual elements before the measurement of characteristics and the individual devices are sent to, for example, an automatic handler while they are arranged similarly in a predetermined manner.

BRIEF DESCRIPTION OF THE DRAWINGS

FIGS. 1a to 1d show the steps of a process for fabricating semiconductor devices, as an embodiment of this invention.

DESCRIPTION OF THE PREFERRED EMBODIMENTS

In these figures, those members shown left or right above the respective apparatuses are the outputs of the associated apparatuses for various steps. In FIG. 1a are shown a pair of lead frame hoop supply apparatuses 1, a pair of pellet bonding apparatuses 2 and a pair of wire bonding apparatuses 3. After the wire bonding apparatuses 3 are a resin molding machine (transfer molding machine) 4 and a take-up reel stand 5 having two take-up reels. Two band-shaped lead frame hoops (hoop materials) 6 and 7 are run between the lead frame hoop supply apparatuses 1 and the take-up reel stand 5. The hoop materials 6 and 7 are passed through the associated pellet bonding and wire bonding apparatuses 2 and 3 and between the upper and lower molds of the resin molding apparatus 4. The hoop materials 6 and 7, having been wound on reels 8, are mounted on the lead frame hoop supply apparatuses 1. The shape of the hoop material 6 or 7 is as shown in FIG. 1a; a lead frame unit 9 is one of the same repeated patterns constituting each of the hoop materials and the lead frame unit 9 has three parallel leads 10, a tie bar 11 connecting the ends of the leads 10 with one another and extending perpendicular to the leads 10, and a dam 12 connecting the leads 10 with one another near the remaining ends of the leads 10 and also extending parallel to the tie bar 11. As shown in FIG. 1a, the remaining ends of the leads 10 are expanded in width so as to serve as a pellet bonding portion 13 and wire bonding portions 14. A guide hole 15 is cut in the tie bar 11 of each lead frame unit 9 and the guide pins of the respective apparatuses are fitted in the holes 15 of the hoop material 6 and 7 to send them forward stepwise.

As the hoop materials 6 and 7 are sent forward, semiconductor devices (pellets) 16 each having a transistor circuit are attached onto the pellet bonding portions 13 by the pellet bonding apparatuses 2. The wire bonding apparatuses 3 connects by fine wires 17 the electrodes of the pellets 16 with the wire bonding portions 14. The thus processed lead frame units 9 are then sent to the table of the transfer molding machine 4 and temporarily fixed between the lower mold attached to the table and the upper mold attached to the bolster of the machine 4 so that the pellet and wire bonding portions 13 and 14 before the dams 12 of the leads 10 are thickly covered with resin. The resultant device are as shown at upper right of the transfer molding machine 4; the pellet 16 is covered with molding resin 18. After the molding step, the hoop materials 6 and 7 are wound on the reels 19 of the take-up reel stand 5.

The hoop materials 6 and 7 wound on the reels 19 are placed in a baking furnace 20, with the reels stacked one upon another as shown in FIG. 1b, and the baking treatment follows for several tens of hours (for example, 16 hours) so as to harden the molding resin.

The hoop material 6, after the baking step, is unwound from the reel 19 set on a supply reel stand 21, as shown in FIG. 1C. After the unwanted remnants of resin sticking to the leads have been removed by deflash apparatus 22, the dam 12 connecting the leads 10 with one another is cut away by a dam cutter 23 and then the portions of the leads 10 not covered by resin are coated with solder film in a soldering apparatus 24. The thus treated hoop material 6 is again wound on a reel 25 of a take-up reel stand attached to the soldering apparatus 24.

The hoop materials 6 and 7 wound on the reels 25 are set on the supply reel stand of a selecting apparatus 26 which performs the cutting of tie bars, the measuring of characteristics, the marking and the classification, as shown in FIG. 1d. And as they are unwound, the tie bars 11 connecting the leads 10 are cut away by a tie bar cutter 27 to separate individual transistors 28 from one another. The separated transistors 28 are subjected to characteristic measurement in a characteristic measurement sections 29 and 30, marks are printed on the molding resin heads 18 in marking sections 31 and 32 in accordance with the results of the measurement in the sections 29 and 30, and the printed transistors are subjected to a baking step to make the marks permanent in a baking section 33. The transistors 28 are classified by a classifying mechanism 34 and put into container boxes 35.

According to this embodiment, since the transfer speeds in the selecting and soldering steps must be made different from that in the baking step which requires rather a long time, the hoop material cannot be continuously transferred completely from the starting step to the last step. However, the hoop material can be continuously transferred through several steps so that the efficiency in assembly and the speed in working can be improved. In addition, the overall apparatus can be made less expensive since special loaders and unloaders need not be provided for the respective apparatuses. Further, since the lead frame is in the form of hoop, the chances of the frame being bent and therefore caught in the respective apparatuses, i.e. the causes of faults, can be decreased so that the operability can be improved.

Moreover, in this embodiment the hoop material is wound on a reel for a temporal storage which reel can accommodate a great number of lead frame units. Thus, the system using a small number of reels according to this invention has by far a larger capacity of accommodation than a conventional system using so many magazines so that the present system proves to be very economical.

According to this invention, the hoop material is continuously supplied to the step of characteristic classification and divided into individual transistors just before the characteristic measurement so that they can be prevented from orienting at random, that is, they are self-oriented in a desired posture. Accordingly, there is no need for the orientated supply of transistors for the characteristic measurement apparatus, which is essential for the conventional method, so that the efficiency of fabrication can be improved and it does not almost occur that the leads are caught in the respective apparatuses and bent.

This invention is by no means limited to the above embodiment, but permits of several variations. For example, if a wrapping machine is incorporated in this system, the whole process from raw material to end product can be automatized.

This invention can also be applied to the assembly of electronic parts other than transistors.

Furthermore, according to this invention, if the hoop material is wound on a reel just after the wire bonding step, the wires may be bent undesirably due to pressure of winding to be brought into contact with unwanted portions. It is therefore to be prohibited to wind the hoop material on a reel after wire bonding step and before molding step.

Also, to increase the working efficiency many hoop materials may be processed by using a combination of many pellet bonding apparatuses and a common resin molding apparatus.

As described above, according to the method of producing semiconductor devices embodying this invention, the lead frame is in the form of hoop and a plurality of hoop materials are processed at a time so that the number of the fabricating steps can be lessened, the speed of working can be increased, the operability of every apparatus can be improved, and the supervision of production can be facilitated.

Further, this invention need not use many magazines as used in the conventional method and therefore can be realized with less expense. And the capability of transferring many lead units at a time assures an excellent workability.

We claim:
1. A method of fabricating semiconductor devices, comprising:
  (a) a pellet bonding step for successively bonding semiconductor pellets onto at least one lead frame hoop which is a series of the same repeated patterns of lead frame units and which is supplied from at least one reel;
  (b) a wire bonding step for connecting the electrodes of each said pellet with the leads of each said lead frame unit;
  (c) a resin molding step for molding with resin the wire-bonded portions of said pellets and said leads;
  (d) a step for winding said lead frame hoop on another reel;
  (e) a baking step for baking the resin-molded wound-up lead frame;
  (f) a soldering step for covering the portions of said leads protruding from the resin molds;
  (g) a cutting step for cutting said lead frame hoop into individual semiconductor devices; and
  (h) a step for measuring the characteristics of each of said semiconductor devices, and classifying and marking said semiconductor devices.

2. A method of fabricating semiconductor devices, as claimed in claim 1, wherein a plurality of parallel lines each having said pellet bonding step and said wire bonding step are provided before said molding step and a plurality of lead frame hoops arranged on the respective lines are collected into one line at said molding step.

3. A method of fabricating semiconductor devices, as claimed in claim 1, wherein said lead frame unit has three parallel leads, a tie bar connecting the ends of said leads with one another and extending perpendicular to said leads and a dam connecting said leads with one another near the remaining ends of said leads and also extending parallel to said tie bar.

4. A method of fabricating semiconductor devices, as claimed in claim 3, wherein said remaining ends of said leads are expanded in width to serve as a pellet bonding portion and wire bonding portions.

5. A method of fabricating semiconductor devices, as claimed in claim 1, wherein a guide hole is cut in every lead frame unit and the guide pins of the apparatuses employed in the respective steps are fitted in said guide holes of said lead frame hoop to transfer said hoop stepwise.

6. A method of fabricating semiconductor devices, as claimed in claim 1, wherein said resin molding step is performed by passing said lead frame hoop between an upper and a lower molds.

7. A method of fabricating semiconductor devices, as claimed in claim 1, wherein said step for characteristic measurement, classification and marking of said semiconductor devides is performed with the arrangement of said devides unvaryingly oriented.

8. A method of fabricating semiconductor devices, said method comprising the steps of:
preparing a lead frame strip formed of a series of the same repeated lead frame unit each having plural lead members;
mounting a semiconductor element to at least one of said lead members of each of said lead frame units;
molding each said semiconductor element with resin;
winding said lead frame strip on a reel after said molding step;
baking the resin-molded wound-up lead frame strip;
and performing succeeding steps for producing the semiconductor devices in an unwound condition of said lead frame strip.

9. A method of fabricating semiconductor devices according to claim 8, wherein said succeeding steps include the step of separating said lead frame strip so as to provide individual resin-molded semiconductor devices.

10. A method of fabricating semiconductor devices according to claim 9, wherein each of said lead frame units has one lead member for mounting said semiconductor element and two other lead members for connecting to the electrodes of said semiconductor element.

11. A method of fabricating semiconductor devices according to claim 10, wherein said plural lead members are connected from each other by a tie bar extending in the direction of the series of said same repeated lead frame units.

12. A method of fabricating semiconductor devices according to claim 9, wherein said succeeding steps further include the step of soldering at least a portion of each of said lead members.

13. A method of fabricating semiconductor devices according to claim 8, wherein the baking time in said baking step is different from the treating time in each of said succeeding steps.

* * * * *